United States Patent [19]

Clark et al.

[11] Patent Number: 5,098,866

[45] Date of Patent: Mar. 24, 1992

[54] METHOD FOR REDUCING HOT-ELECTRON-INDUCED DEGRADATION OF DEVICE CHARACTERISTICS

[75] Inventors: David R. Clark, Garland; Charlotte M. Tipton, Allen, both of Tex.

[73] Assignee: Texas Instruments Incorporated, Dallas, Tex.

[21] Appl. No.: 290,073

[22] Filed: Dec. 27, 1988

[51] Int. Cl.$^5$ ................... H01L 21/302; H01L 21/28
[52] U.S. Cl. .................................. 437/239; 437/228; 437/238; 437/941; 437/946
[58] Field of Search ................. 437/238, 239, 946, 42, 437/228, 10, 13, 941; 134/26, 30, 34, 37

[56] References Cited

U.S. PATENT DOCUMENTS

| | | | |
|---|---|---|---|
| 4,264,374 | 4/1981 | Beyer et al. | 437/946 |
| 4,585,668 | 4/1986 | Asmussen et al. | 437/238 |
| 4,608,097 | 8/1986 | Weinberger et al. | 437/946 |
| 4,748,131 | 5/1988 | Zietlow | 437/24 |

FOREIGN PATENT DOCUMENTS

| | | | |
|---|---|---|---|
| 0138236 | 10/1980 | Japan | 437/946 |
| 0062329 | 3/1988 | Japan | 437/946 |
| 0046975 | 9/1988 | Japan | 437/946 |
| 0244735 | 10/1988 | Japan | 437/946 |

OTHER PUBLICATIONS

Wolf et al., *Silicon Processing for the VLSI Era, vol. 1: Process Technology*, Lattice Press, 1986, p. 164.
*Hot-Electron-Induced MOSFET Degradation-Model, Monitor, and Improvement*, IEEE Journal of Solid-State Circuits, vol. SC-20, No. 1, Feb., 1985; pp. 295-305; Hu, Tam, Hsu, Ko, Chan and Terrill.
*Effect of Final Annealing on Hot-Electron-Induced MOSFET Degradation*, IEEE Electron Device Letters, vol. EDL-6, No. 7, Jul., 1985; pp. 369-371; Hsu and Chiu.
*Dramatic Improvement of Hot-Electron-Induced Degradation in MOS Structures Containing F or Cl in SiO$_2$*, IEEE Electron Device Letters, vol. 9, No. 1, Jan., 1988; pp. 38-40; Nishioka, Da Silva, Jr., Wang and Ma.
*Hot-Electron-Induced Degradation of Conventional, Minimum Overlap, LDD and DDD N-Channel MOSFETs*, IEEE Circuits and Devices Magazine, Mar., 1988; pp. 9-15; Liou, Teng and Merrill.

*Primary Examiner*—Olik Chaudhuri
*Assistant Examiner*—M. Wilczewski
*Attorney, Agent, or Firm*—James C. Kesterson; James T. Comfort; Melvin Sharp

[57] ABSTRACT

Hot-electron-induced degradation of a semiconductor device (10) is reduced by converting the silicon surface (18) to a fluorinated-silicon compound interface region (23). The fluorinated-silicon compound interface region (23) is formed by etching the device (10) in a fumer (30) using anhydrous hydrofluoric acid. After a sacrificial oxide is grown over the silicon surface (18), the device (10) is placed in a container (32). A mixture of nitrogen, moistened nitrogen and nitrogen/anhydrous hydrofluoric acid is injected into the container (32) to conduct the etch. The anhydrous hydrofluoric acid converts the silicon to a fluorinated-silicon compound, such as $H_2SiF_6$, and water. The fluorinated-silicon compound interface region (23) has stronger molecular bonds than the typical hydrogen-silicon formed at the oxide/silicon interface and is, therefore, less likely to be broken apart by hot-electrons.

8 Claims, 2 Drawing Sheets

METHOD FOR REDUCING HOT-ELECTRON-INDUCED DEGRADATION OF DEVICE CHARACTERISTICS

TECHNICAL FIELD OF THE INVENTION

This invention relates to semiconductor devices, and in particular to reducing hot-electron-induced degradation of semiconductor devices.

BACKGROUND OF THE INVENTION

Hot-electron-induced degradation of semiconductor devices is considered to be one of the most limiting factors in down-scaling transistors. Hot-electron-induced degradation is caused by the introduction of a relatively high voltage to the drain of a silicon metal-oxide-semiconductor (MOS) transistor. A widely accepted physical model is that the introduction of the voltage causes electrons to gain enough energy to break silicon-hydrogen bonds formed in the interface between the gate oxide and the silicon substrate.

If the electrons gain enough energy, the collision therebetween causes hydrogen atoms to break from the silicon and diffuse harmlessly away from the interface. The remaining silicon radicals, however, remain and become a charge trap which may undesirably shift the threshold voltage by attracting and holding electrons rather than allowing them to flow between diffused regions (a source and a drain) as required. For example, in a 1-micron transistor having an approximately 200 Angstroms thick layer of gate oxide, approximately 8 volts may be (depending upon the details of the structure) all the voltage required to cause degradation of transistor characteristics.

Several methods have been developed to attempt to resolve hot-electron-induced degradation, all of which have generally fallen short. One such method comprises the use of a lightly-doped drain (LDD) positioned proximate a highly-doped region. The LDD spreads the electric field in an attempt to prevent the hot electrons from gaining sufficient energy to break the silicon-hydrogen bonds. The use of an LDD helps reduce but does not eliminate the effects of hot-electron-induced degradation. Additionally, the use of an LDD may actually further degrade the transistor by creating higher resistance than desired.

Another method used to try to reduce the effects of hot-electron-induced degradation is the use of a nitrogen rather than a hydrogen ambient to perform the final anneal to reduce the amount of hydrogen available to bond with silicon. Although the use of a nitrogen ambient reduces the amount of hydrogen available to bond with silicon, it is difficult under present technologies to eliminate hydrogen entirely, since many processes are hydrogen-dependent. Thus, while the use of nitrogen may reduce the amount of hydrogen present, it does not eliminate hydrogen nor the problems caused by hot-electron-induced degradation.

An additional method to reduce the amount of hot-electron-induced damage is to introduce fluorine or chlorine during thermal oxidation which is disclosed in Nishioka, *Dramatic Improvement of Hot-Electron-Induced Interface Degradation in MOS Structures Containing F or Cl in SiO₂*, IEEE Electron Device Letters, Vol. 9, No. 1 (January, 1988). Unfortunately, the use of fluorine as disclosed by Nishioka is difficult to control and typically requires a wet rinse which adds contaminants to the surface and therefore causes additional problems. Likewise, the use of chlorine requires strict controls which add to the complexity of the process and can create additional problems if the proper chlorine levels are not strictly maintained. Thus, there is a need for a relatively simple method for forming transistors which avoid the effect of hot-electron-induced degradation.

SUMMARY OF THE INVENTION

The present invention disclosed herein comprises a method and apparatus for reducing hot-electron-induced degradation of silicon semiconductor devices which eliminates or substantially reduces problems associated with prior hot-electron-reduction methods. The present invention allows the formation of a gate oxide over a silicon surface which is not subject to the effects of hot-electron-induced degradation.

In accordance with one aspect of the present invention, an apparatus removes a previously grown sacrificial oxide from a silicon surface. The apparatus comprises a chamber for holding a wafer upon which the sacrificial oxide has been grown. A first source injects nitrogen gas into the chamber while a second source injects water-moistened nitrogen into the chamber. Simultaneously, a third source mixes nitrogen gas and anhydrous hydrofluoric acid, which is then also injected into the chamber to etch the sacrificial oxide.

In a further aspect of the invention, the etch may be stopped just prior to removing all the sacrificial oxide and a rinser may be used to remove any contaminants from the surface of the wafer. A spin drier is used to dry the wafer prior to a final etching in the apparatus.

Depending upon whether or not the rinse step is used, a final re-etching within the apparatus may be necessary to remove any remaining sacrificial oxide. The etching allows fluorine from the anhydrous hydrofluoric acid to combine with silicon atoms on the substrate to form a fluorinated-silicon surface rather than a silicon-hydrogen surface. A gate oxide may then be grown over the fluorinated-silicon surface to create a device that avoids the effects of hot-electron-induced degradation.

It is a technical advantage of the present invention that there is a reduction in the amount of hydrogen trapped in the interface between the silicon surface and the gate oxide. It is a further technical advantage that hot-electron-induced degradation of the semiconductor device is lessened by the reduction of the number of silicon-hydrogen bonds from the interface between the substrate and the gate oxide.

BRIEF DESCRIPTION OF THE DRAWINGS

For a more complete understanding of the present invention and for further advantages thereof, reference is now made to the following Detailed Description taken in conjunction with the accompanying Drawings, in which.

DETAILED DESCRIPTION OF THE INVENTION

Figure 1:
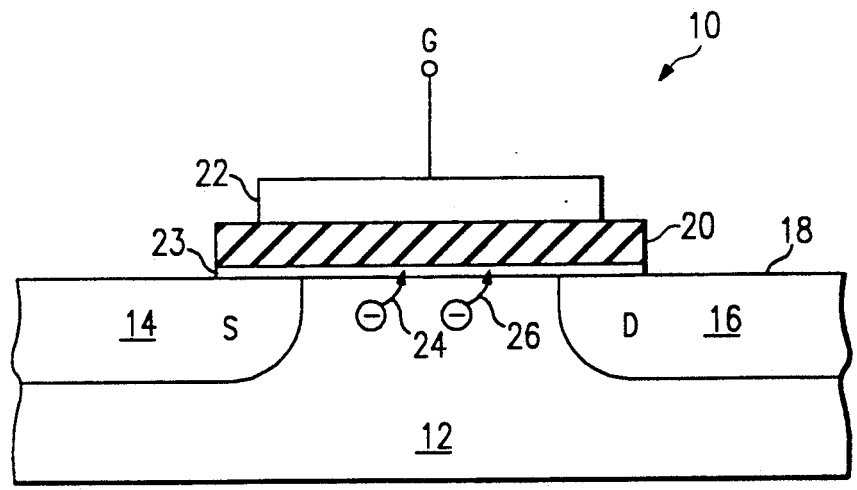
FIG. 1 is a cross-sectional view of a standard MOS transistor formed in accordance with the preferred embodiment of the present invention.

Referring to FIG. 1, a semiconductor device, such as a short channel silicon metal-oxide-semiconductor (MOS) transistor, formed in accordance with the preferred embodiment of the present invention is generally identified by the reference numeral 10. The device 10 comprises a silicon substrate 12 and diffused regions 14 and 16, which may comprise a source and a drain, respectively. Formed over the top surface 18 of the substrate 12 is an insulator layer 20, such as silicon dioxide, which forms the gate oxide.

Formed over the insulator layer 20 is a conductive layer 22, such as a polysilicon electrode gate for introduction of a voltage at G. A fluorinated-silicon compound interface region 23 is formed in accordance with the present invention to reduce the effects of hot-electron-induced degradation by reducing the formation of silicon-hydrogen bonds at or near the interface between the insulator layer 20 and the silicon substrate 12, as will be subsequently described in greater detail.

When a voltage is applied at G, channels are opened in the substrate 12 between the diffused regions 14 and 16. Electrons, as indicated by reference numerals 24 and 26, may break silicon-hydrogen bonds at the interface. Silicon-hydrogen bonds may be formed during any wafer processing in which hydrogen is present. If the electrons 24 and 26 have enough energy, they may strip hydrogen from a silicon-hydrogen bond, and create silicon radicals. The silicon radicals may then act as a trap for charges (electrons), which can undesirably shift the threshold voltage. For example, if the device 10 comprises a 1-micron transistor with a 200-Angstroms thick layer of oxide, approximately 8 volts (depending upon the structure details) could be capable of providing sufficient energy to electrons to strip hydrogen from silicon-hydrogen molecules.

The method in accordance with the present invention creates an interface between the substrate 12 and the oxide 20 comprising fluorinated-silicon compounds which exclude formation of the silicon-hydrogen bonds. The fluorinated-silicon compounds have stronger molecular bonds than those of silicon-hydrogen, and hot electrons are unable to break the fluorinated-silicon bonds to form charge traps. Since the device 10 is constructed to avoid the formation of silicon-hydrogen bonds by the formation of the fluorinated-silicon compound interface region 23, the device 10 is less likely to be effected by hot-electron-induced degradation.

Figure 2A:
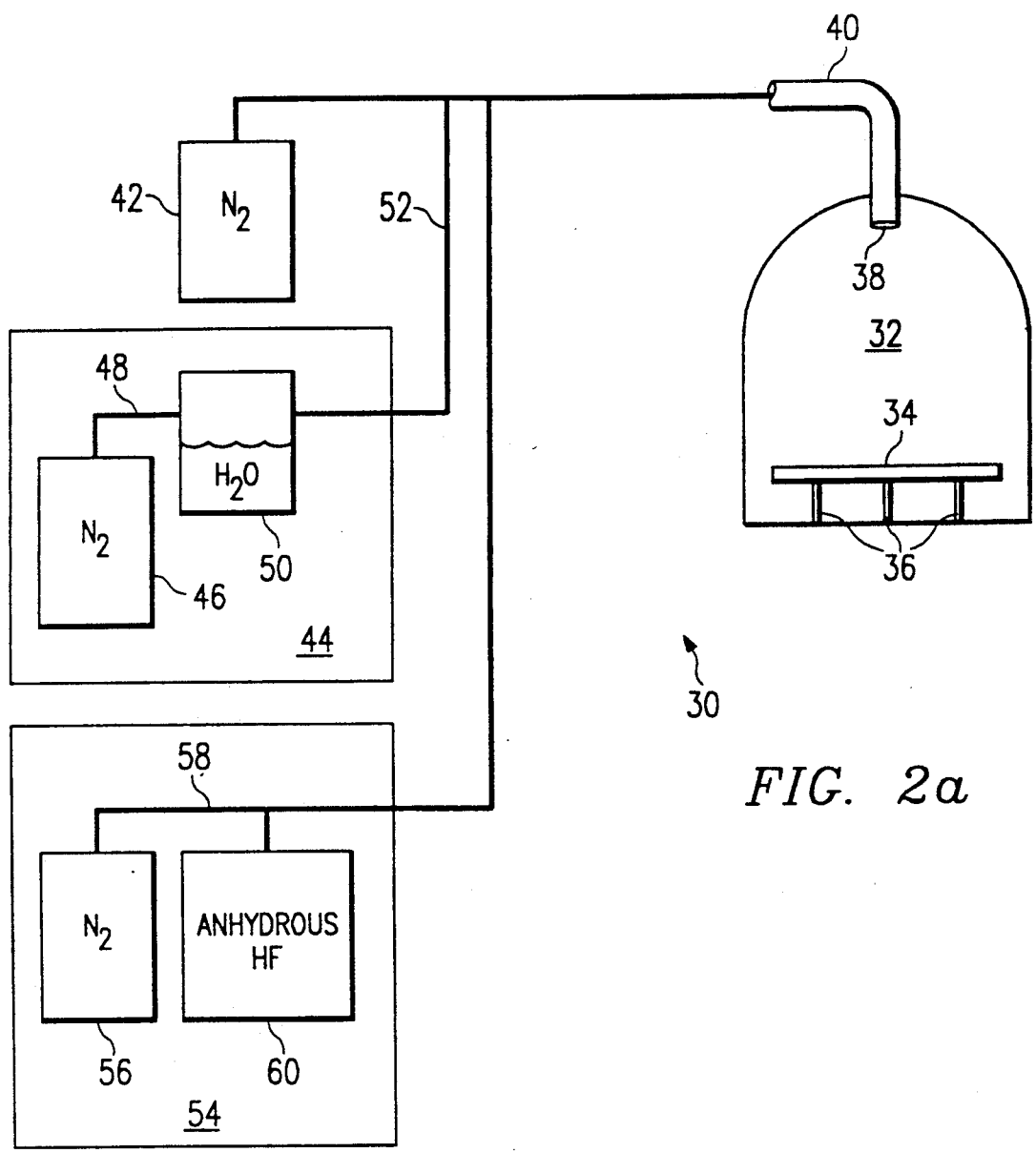
FIGS. 2-*b* are cross-sectional views of an apparatus constructed in accordance with the preferred embodiment of the present invention.

Referring to FIG. 2, a cross-sectional view of an apparatus which may be used to form an interface between a substrate and a gate oxide in accordance with the preferred embodiment of the present invention is generally identified by the reference numeral 30. The apparatus 30 comprises a fumer, such as is available from FSI International under their product name Excalibur. The apparatus 30 comprises an atmospheric chamber 32, which houses a silicon wafer 34 upon pedestals 36 for processing. The chamber 32 has an inlet 38, which is interconnected by a tube 40 to a plurality of gas sources.

A first source 42 supplies a relatively high volume of nitrogen to the chamber 32 while a second source 44 supplies moistened nitrogen of a relatively lesser volume than source 42 to the chamber 32. The second source 44 comprises a nitrogen container 46 interconnected by a tube 48 to a container 50. The nitrogen from container 46 passes through the tube 48 into the container 50, which has a supply of water therein. As the nitrogen passes over the water within the container 50, the nitrogen picks up moisture therefrom, and the moistened nitrogen is passed via tubes 52 and 40 into the chamber 32.

A third source 54 provides a mixture of nitrogen and anhydrous hydrofluoric acid (HF) to the chamber 32. The third source 54 comprises a nitrogen container 56 interconnected via tube 58 to an anhydrous HF container 60. Nitrogen from the container 56 is mixed with anhydrous HF from the container 60 and is then passed to the chamber 32 by tubes 58 and 40.

To process the wafer 34 in accordance with the present invention, the first, second and third sources 42, 44 and 54 inject their contents into the chamber 32. The mixture etches a sacrificial silicon dioxide ($SiO_2$) layer (not shown) which was previously formed over the wafer 34. The HF reacts with the silicon wafer 34 to form fluorinated-silicon compounds, for example, $H_2SiF_6$, and water. The water is either removed as a vapor from the chamber 32 or is further consumed by the reaction.

The wafer 34 may then be further processed by growing a gate oxide thereon. The fluorinated-silicon compounds provide a silicon-hydrogen free surface for the subsequent formation of a gate oxide thereon. The molecular bonds formed by the fluorinated-silicon compounds are much stronger than those of silicon-hydrogen and are less likely to be broken by a hot-electron. Thus, the likelihood of device degradation by the formation of silicon radical charge traps induced by hot-electrons is greatly reduced.

Figure 2B:
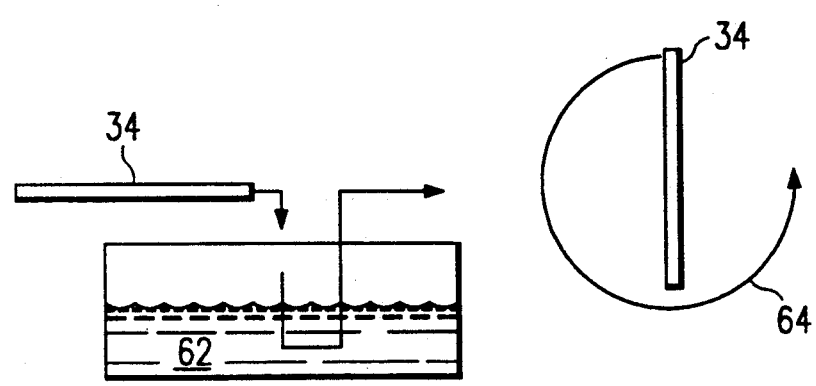

In an alternative embodiment of the present invention, the wafer 34 is processed in the chamber 32 until only a very thin film of sacrificial $SiO_2$ remains. The wafer 34 is then removed from the chamber 32 for further processing as illustrated by FIG. 2b. The wafer 34 is washed in a deionized water solution 62 to remove any residue that was not volatized, and the wafer 34 is dried in a conventional spin-drying apparatus as indicated by arrow 64.

The wafer 34 is then returned to the chamber 32 for a re-etching cycle to completely remove all the remaining sacrificial $SiO_2$ and form a fluorinated-silicon compound surface as previously described above. A gate oxide is formed over the fluorinated-silicon compound surface and the likelihood of device degradation from the effects of hot-electrons is reduced.

Figure 3:
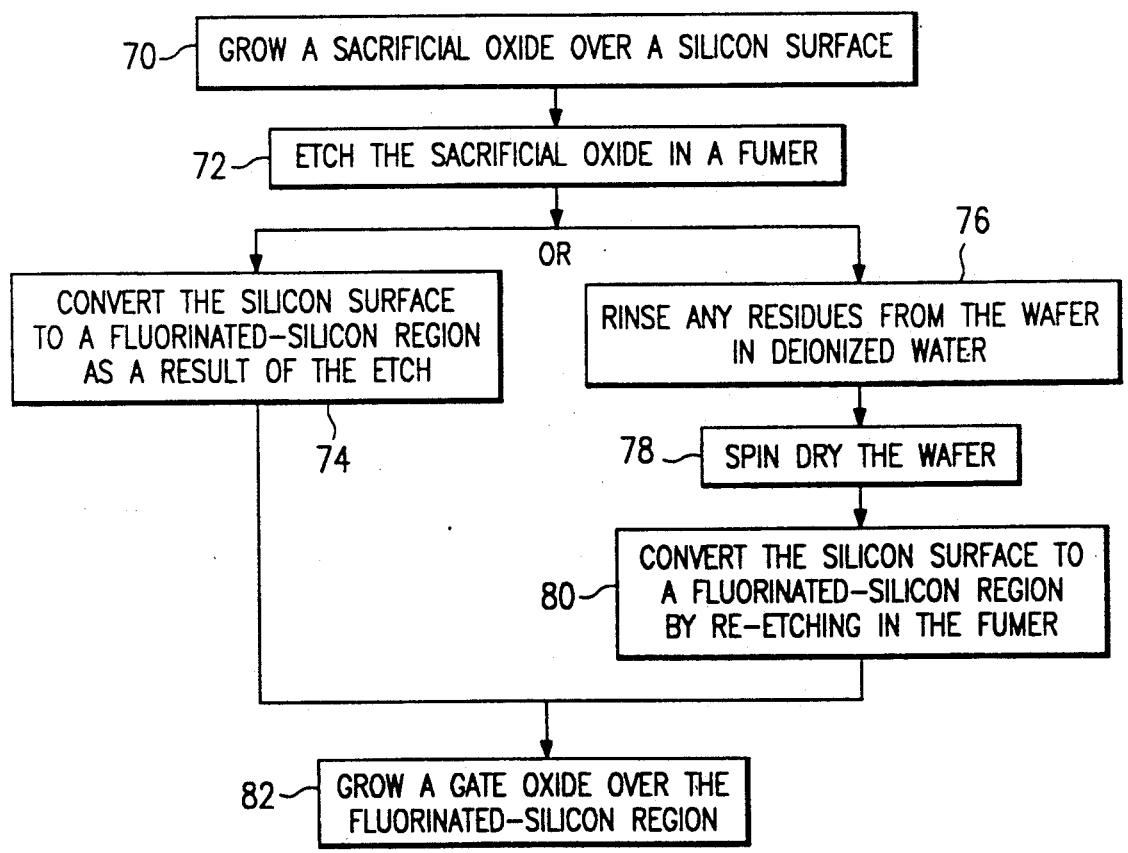
FIG. 3 is a flow chart of the fabrication steps utilized in the preferred embodiment of the present invention.

Referring to FIG. 3, a step-by-step application of the method in accordance with the present invention is illustrated:

Step 1 at 70: Grow a sacrificial oxide over a silicon surface;

Step 2 at 72: Etch the sacrificial a fumer; and either

Step 3 at 74: Convert the silicon to a fluorinated-silicon compound interface region as a result of the etch of Step 2; OR at 76: Rinse any residue from the wafer in deionized water;

at 78: Spin dry the wafer; and at 80: Convert the silicon surface to a fluorinated-silicon compound interface region by re-etching in a fumer; and Step 4 at 82: Grow a gate oxide on the fluorinated-silicon compound surface.

It may thus be seen that the present invention provides an improved technique for reducing hot-electroninduced degradation of semiconductor devices. By substantially replacing silicon-hydrogen bonds at or near the interface between an insulator and a silicon substrate with a fluorinated-silicon compound interface region, hot-electrons are less capable of forming silicon radical charge traps and degrading the device.

Although the present invention has been described with respect to a specific preferred embodiment thereof, various changes and modifications may be suggested to one skilled in the art, and it is intended that the present invention encompass such changes and modifications as fall within the scope of the appended claims.

What is claimed is:

1. A method for protecting a semiconductor device from hot-electron-induced degradation, comprising the steps of:
    growing a sacrificial oxide on a silicon surface;
    providing a chamber;
    injecting nitrogen into said chamber;
    injecting moistened nitrogen into said chamber;
    injecting nitrogen mixed with anhydrous hydrofluoric acid into said chamber;
    etching said sacrificial oxide so as to convert said silicon surface to an interface region having sufficiently strong molecular bonds that hot electrons cannot break such bonds to create charge traps; and
    growing a gate oxide on said interface region.

2. The method of claim 1, wherein said step of etching comprises forming a fluorinated-silicon compound interface region.

3. A method for protecting a semiconductor device from hot-electron-induced degradation, comprising the steps of:
    growing a sacrificial oxide on a silicon surface;
    etching said surface with anhydrous hydrofluoric acid and nitrogen to remove most of said sacrificial oxide;
    rinsing the device in deionized water;
    drying the device;
    re-etching said surface in anhydrous hydrofluoric acid and nitrogen to remove the remaining sacrificial oxide and to form a fluorinated-silicon compound interface region; and
    growing a gate oxide on said interface region.

4. A method for reducing the effects of hot-electron-induced degradation on a semiconductor device, comprising the steps of:
    placing the device in a chamber;
    injecting a mixture of nitrogen, moistened nitrogen and nitrogen/anhydrous hydrofluoric acid into said chamber to etch a sacrificial oxide from a silicon surface of the device; and
    converting said silicon surface to a fluorinated-silicon compound interface region such that the effects of hot-electron-induced degradation are substantially reduced.

5. The method of claim 4, further comprising the steps of:
    washing the device in deionized water; and
    spin drying the device.

6. A method for protecting a semiconductor device from hot-electron-induced degradation, comprising the steps of:
    growing a sacrificial oxide on a silicon surface;
    exposing said sacrificial oxide to moistened nitrogen and anhydrous hydrofluoric acid to etch said sacrificial oxide and form a fluorinated-silicon compound interface region having sufficiently strong molecular bonds that hot electrons cannot break such bonds to create charge traps; and
    growing a gate oxide on said interface region.

7. The method of claim 6, wherein the step of exposing comprises etching said sacrificial oxide in a chamber with said anhydrous hydrofluoric acid and nitrogen.

8. The method of claim 7, wherein the step of etching comprises:
    injecting nitrogen into said chamber;
    injecting moistened nitrogen into said chamber; and
    injecting nitrogen mixed with said anhydrous hydrofluoric acid into said chamber.

* * * * *